United States Patent [19]

Mahbobzadeh et al.

[11] Patent Number: 5,052,016
[45] Date of Patent: Sep. 24, 1991

[54] RESONANT-PERIODIC-GAIN DISTRIBUTED-FEEDBACK SURFACE-EMITTING SEMICONDUCTOR LASER

[75] Inventors: Mohammad Mahbobzadeh; Marek A. Osinski, both of Albuquerque, N. Mex.

[73] Assignee: University of New Mexico, Albuquerque, N. Mex.

[21] Appl. No.: 526,083

[22] Filed: May 18, 1990

[51] Int. Cl.⁵ .................................................. H01S 3/19
[52] U.S. Cl. ...................................... 372/96; 372/45; 372/47; 372/50; 372/92
[58] Field of Search ........................ 372/96, 50, 45, 46, 372/47, 92

[56] References Cited

U.S. PATENT DOCUMENTS 4,675,876  6/1987  Svilans ................................... 372/96
4,881,236  11/1989  Brueck et al. ......................... 372/45

OTHER PUBLICATIONS

Geels, R. S. et al., "Low Threshold Planarized Vertical-Cavity Surface-Emitting Lasers", *IEEE Photonics Technology Letters*, vol. 2, No. 4, Apr. 1990, pp. 234-236.

Jewell, J. L., et al., "Vertical Cavity Single Quantum Well Laser", Postdeadline Papers CLEO 1989 Conference on Lasers and Electro-Optics, Baltimore, MD. Apr. 24-28, 1989, pp. PD14-1-PD14-2.

Ogura, M., et al., "Surface Emitting Laser Diode with $Al_xGa_{1-x}As/GaAs$ Multilayered Heterostructure", J. Vac. Sci. Tech. B 3(2), pp. 784-787, Mar./Apr. 1985.

Nomura, Y., et al., "GaAs/AlGaAs Distributed Feedback Structure with Multiquantum Well for Surface-Emitting Laser", J. Appl. Phys. 60(3), pp. 874-877, Aug. 1986.

*Primary Examiner*—James W. Davie
*Attorney, Agent, or Firm*—Albert Sopp

[57] ABSTRACT

A resonant-periodic-gain distributed-feedback surface-emitting semiconductor laser has a resonator with an axis perpendicular to the plane of the substrate. The resonator comprises a stack of distributed feedback elements, each consisting of a spacer region and a very thin gain element positioned at an antinode of a standing wave inside the resonator at a designed wavelength. Each gain element consists of one or a group of closely spaced quantum-well layers. Each spacer, separating two adjacent gain elements, consists of two intermediate-and low-refractive-index layers, each layer of the spacer having an optical thickness approximately equal to a quarter of the designed wavelength. The refractive index of each of the gain elements is higher than that of the spacer materials. The device can be surrounded by a material of refractive index lower than all materials comprising the device for better confinement of carriers and control of guided modes of radiation. The structure can be directly pumped either optically or with an electron beam. Also, various well known schemes for electrical pumping can be utilized. The devices can be arranged to form one- or two-dimensional arrays.

15 Claims, 3 Drawing Sheets

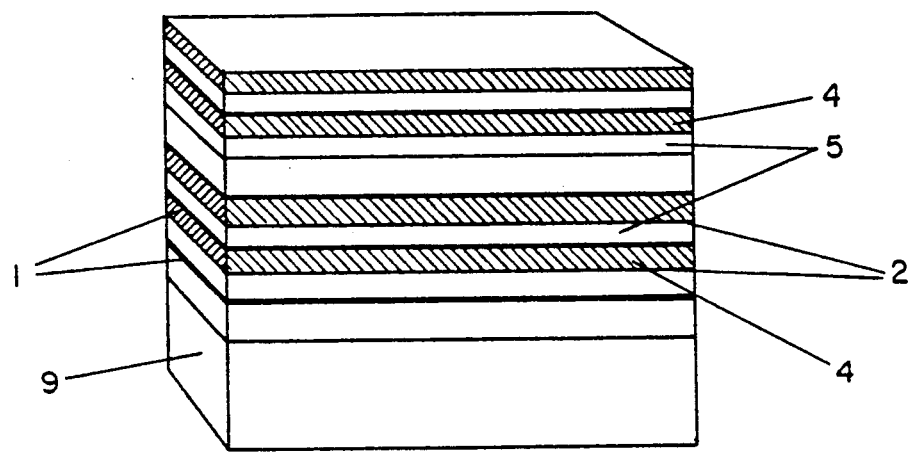
FIG—3
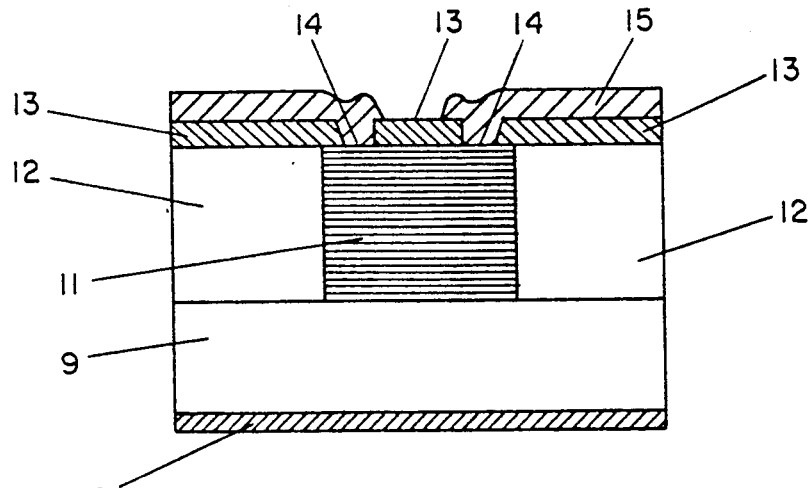
FIG—4
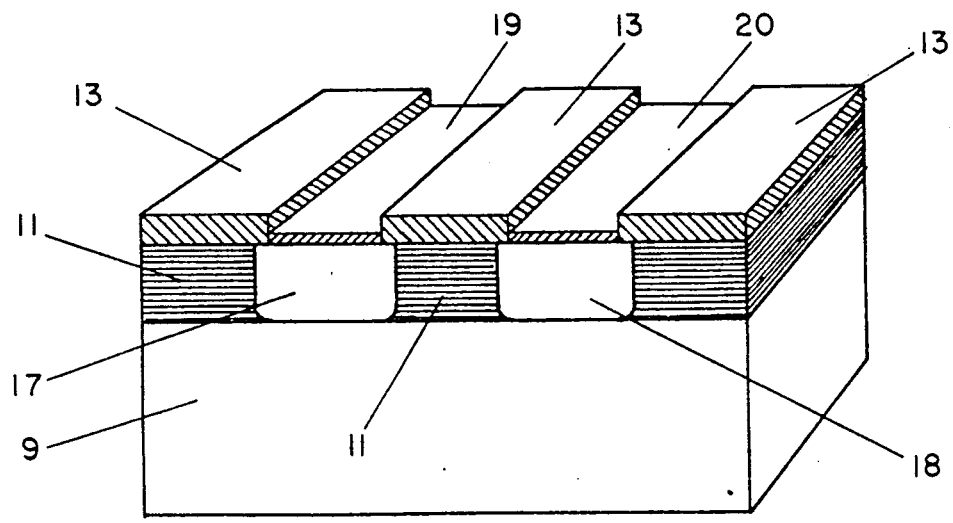
FIG—5

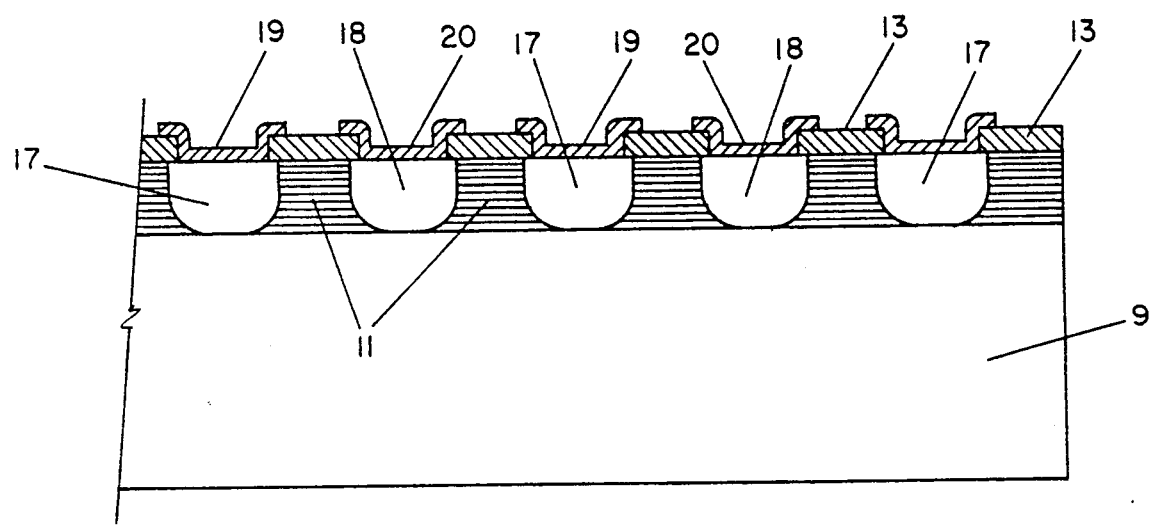
FIG—6
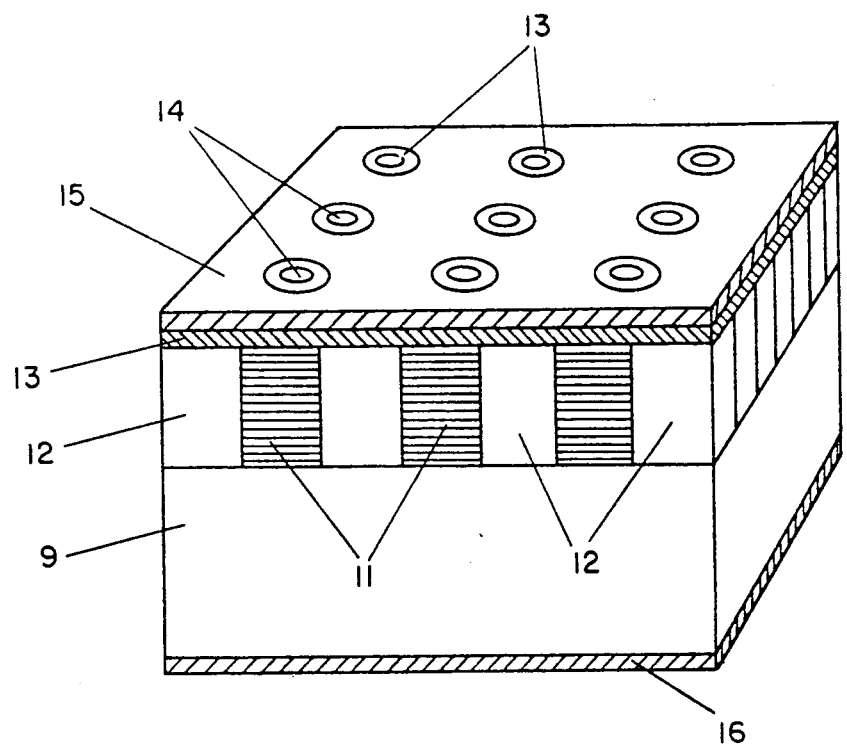
FIG—7

2

RESONANT-PERIODIC-GAIN DISTRIBUTED-FEEDBACK SURFACE-EMITTING SEMICONDUCTOR LASER

BACKGROUND AND FIELD OF THE INVENTION

Surface-emitting semiconductor lasers that emit radiation in the direction perpendicular to the substrate are of considerable interest in view of wide range of their potential applications. There have been several approaches (vertical resonators, second-order grating coupling, and inclined mirrors) to achieve lasing through the surface. Among these, vertical-cavity surface- emitting lasers have the benefit of planar geometry and stable single- longitudinal-mode oscillation. Small-area low-threshold-current lasers can be used in optical computing and can be integrated with other optoelectronic devices to form part of monolithic optoelectronic integrated circuits and optical interconnects. Their low-divergence circular output beam simplifies the optics requirements and facilitates coupling into optical fibers. Vertical-cavity surface-emitting lasers can also be easily arranged in one- or two-dimensional arrays to form high-power sources which could find applications in free-space optical communication and as solid-state laser pumps.

DISCUSSION OF RELATED ART

Conventional vertical-cavity surface-emitting lasers suffer from low external efficiency and consequently low output power. The primary reason for their poor performance lies in the competition between the desirable vertical emission and parasitic amplification of radiation emitted spontaneously in the directions parallel to the substrate plane. In order to suppress the amplified spontaneous emission in the transverse directions and reduce the lasing threshold, S. R. J. Brueck, C. F. Schaus, M.A. Osiński, J. G. McInerney, M. Y. A. Raja, T. M. Brennan, and B. E. Hammons, U.S. Pat. No. 4,881,236 "Wavelength-Resonant Surface-Emitting Semiconductor Laser", issued Nov. 14, 1989, disclose a structure which has a periodic gain medium, with the quantum-well active regions spaced at half the wavelength of a selected optical transition. This enhances the gain in the vertical direction at the designed wavelength and discriminates against the unwanted amplified spontaneous emission parallel to the wafer surface. In addition, more efficient pumping is achieved by placing the active regions at the maxima of the longitudinal mode pattern at the designed wavelength and eliminating excitation of the regions around the nuls of the standing wave. While various versions of the preferred embodiment are considered, the active region in that design is always sandwiched between mirrors forming a Fabry-Perot cavity. Hence, when multilayer Bragg reflectors are used and additional localized gain elements are inserted with half-wavelength periodicity in their portions, the total thickness of the device is relatively large. This makes it more difficult to pump the laser electrically and renders the structure less suitable for monolithic integration.

A special case of the resonant-periodic-gain surface-emitting laser with a single-quantum-well active layer sandwiched between two Bragg reflectors is described by J. L. Jewell et al., "Vertical Cavity Single Quantum Well Laser", Postdeadline Papers CLEO 1989 Conference on Lasers and Electro-Optics, Baltimore, Md., Apr. 24-28, 1989, pp. PD14-1-PD14-2. This structure is optimal from the point of view of its total thickness and uniform electrical pumping. However, the total output power is small since only one active region is pumped.

Distributed-feedback structures have been proposed in the past in the context of conventional vertical-cavity surface-emitting lasers. M. Ogura and T. Yao, "Surface Emitting Laser Diode with $Al_xGa_{1-x}As$/GaAs Multilayered Heterostructure", J. Vac. Sci. Technol. B3(2), pp. 784-787, March/Apr. 1985, realize such a device with AlGaAs/GaAs multilayered heterostructure both by optical pumping and current injection. The structure consists of a series of alternating quarter-wavelength layers of GaAs (constituting the active region) and AlGaAs which form a distributed- feedback resonator. One half-wavelength layer of GaAs in the central part of the structure provides a phase-shift necessary to select a desired distributed feedback mode. A modified version of the Ogura and Yao device is disclosed by M. N. Svilans in the U.S. Pat. No. 4,675,876 "Bragg Distributed Feedback Surface Emitting Laser", issued June 23, 1987. The Svilans structure has an additional lateral confining region which allows to pump electrically the whole volume of the multilayer columnar active region. Another modification of the Ogura and Yao device which utilizes a higher gain coefficient of quantum-well material is described by Y. Nomura et al., "GaAs/AlGaAs Distributed Feedback Structure with Multiquantum Well for Surface-Emitting Laser", J. Appl. Phys. 60(3), pp. 874-877, Aug. 1986. The bulk quarter-wavelength active regions of GaAs are replaced with multiple quantum wells of the same quarter-wavelength cumulative thickness. There is no connection, however, between the positioning of the quantum wells and the standing wave pattern inside the resonator.

SUMMARY OF THE INVENTION

The present invention eliminates the need for end reflectors in resonant-periodic-gain surface-emitting lasers by interlacing the quarter-wave multilayer high reflectors with the gain medium. This reduces considerably the total thickness of the device, while retaining the characteristic features of the resonant-periodic-gain active region. Specifically, the effective gain per unit length of the active region is maximized by aligning the antinodes of standing-wave optical intensity distribution in the vertical direction (perpendicular to the plane of the substrate) with the periodic gain medium. In the special case of a microlaser consisting of a single thin active region placed in resonance between two Bragg reflectors, the present invention permits increase of the output power of the device, retaining its resonant-gain properties without increasing the total thickness of the structure.

BRIEF DESCRIPTION OF THE DRAWINGS

Referring to the drawings in which like reference numerals denote like parts:

FIG. 3 is a schematic diagram of a resonant-periodic-gain distributed-feedback surface-emitting laser structure in accordance with an embodiment of the present invention;

FIG. 4 is a schematic diagram of a buried-heterostructure resonant-periodic-gain distributed-feedback surface-emitting laser in accordance with an embodiment of the present invention;

FIG. 5 is a schematic diagram illustrating a transverse-junction scheme for electrical pumping of the resonant-periodic-gain distributed-feedback surface-emitting laser in accordance with an embodiment of the present invention;

FIG. 6 is a schematic diagram of a linear array of resonant-periodic-gain distributed-feedback surface-emitting lasers in accordance with an embodiment of the present invention; and FIG. 7 is a schematic diagram of a two-dimensional array of resonant-periodic-gain distributed-feedback surface-emitting lasers in accordance with an embodiment of the present invention.

DESCRIPTION OF THE PREFERRED EMBODIMENT

Figure 1:
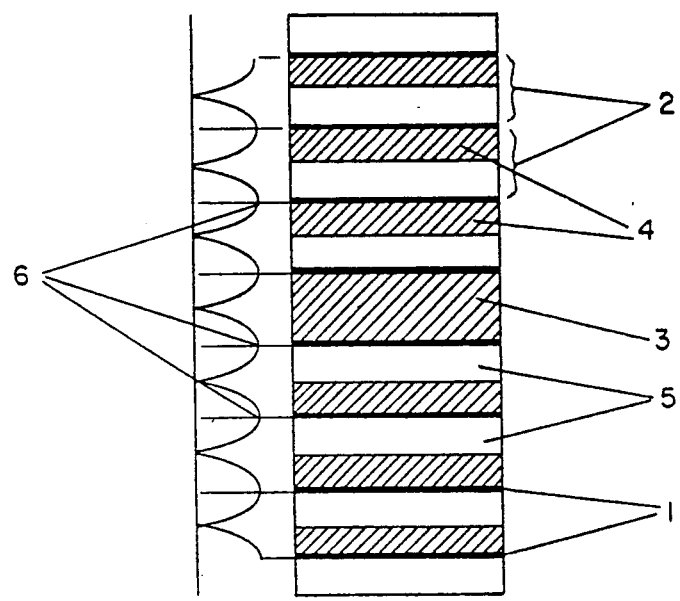
FIG. 1 is a schematic diagram of a section of a resonant-periodic-gain distributed-feedback active layer along with a standing-wave intensity pattern to illustrate the alignment of antinodes with active elements in accordance with an embodiment of the present invention.

In accordance with the present invention, a surface-emitting semiconductor laser is provided with a resonant-periodic-gain distributed-feedback active medium which enhances the effective gain per unit length of the active region and minimizes the total thickness of the device. Simultaneously, the threshold current of the device is reduced and the output power is increased. A multilayer structure of the distributed-feedback resonant-periodic-gain medium is shown in FIG. 1. The principal elements of the structure are the periodically arranged very thin active regions 1 separated by spacers 2, with at least one of the spacers replaced by a phase shifter 3. Each spacer 2 consists of alternating quarter-wave layers 4 and 5 of intermediate and low refractive index, respectively, the refractive index of the layer 4 being lower than that of the active region 1. The spacer 3 is comprised of material of the intermediate refractive index and has the thickness approximately equal to half the designed wavelength of operation. Each active region 1 consists of a single quantum well or a group of multiple quantum wells separated by very thin barriers.

As illustrated in FIG. 1, the thicknesses of various layers in the structure are chosen such that the quantum-well active regions 1 coincide with the antinodes (intensity maxima) 6 of the standing-wave optical field at the designed wavelength of operation. The essential element of the invention is that the optical thickness of each active region 1 is of the order of 1/25 of the designed wavelength of operation. In contrast, in conventional structures with bulk active regions, including the distributed-feedback surface-emitting laser disclosed in the U.S. Pat. No. 4,675,876, issued June 23, 1987, the active region extends over a substantial fraction (at least a half) of a half-wave period of the standing-wave intensity pattern. The overlap of the active regions with the optical intensity maxima in the present invention enhances gain and wavelength selectivity in the vertical direction and significantly reduces amplified spontaneous emission. Compared to the wavelength-resonant surface-emitting laser disclosed in the U.S. Pat. No. 4,881,236, issued Nov. 14, 1989, the present invention affords a substantially shorter total thickness of a device incorporating multilayer high reflectors. This is because the necessary feedback is provided by the spacer regions 2 acting as distributed reflectors, and there is no need for the end reflectors.

Figure 2:
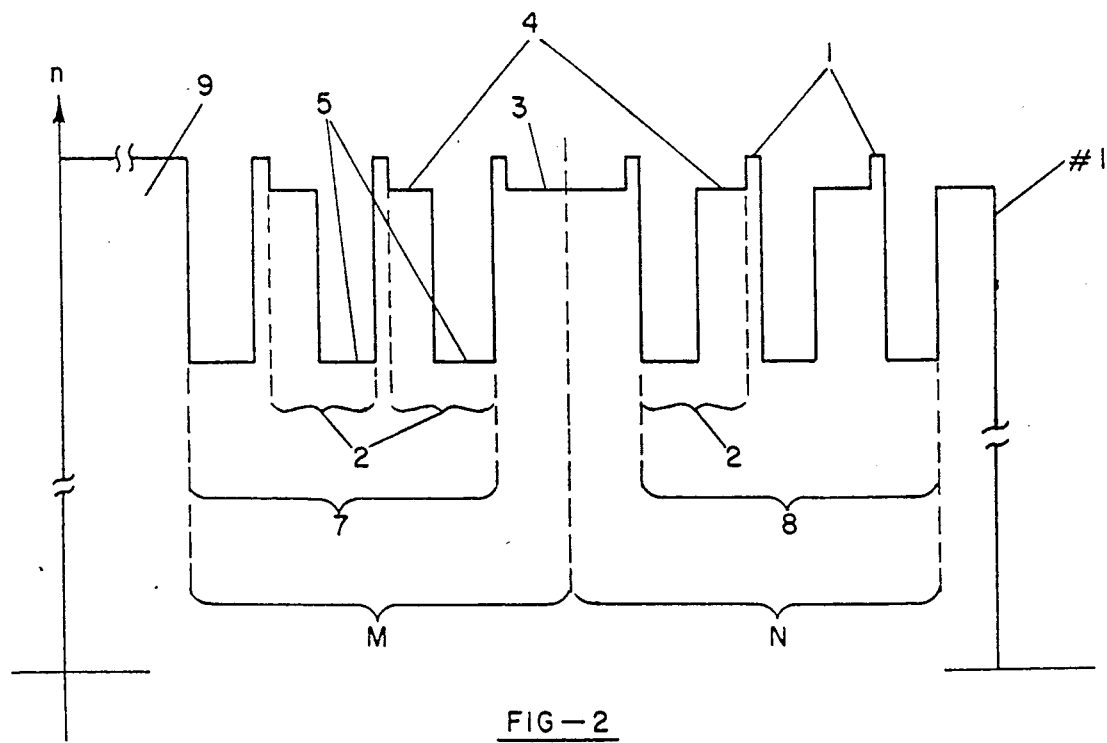
FIG. 2 is a schematic diagram showing a refractive index profile of a resonant-periodic-gain distributed-feedback surface-emitting laser in accordance with an embodiment of the present invention.

FIG. 2 illustrates schematically the refractive index profile of the resonant-periodic-gain distributed-feedback surface-emitting laser shown in FIG. 1. In this figure, the very thin active layers 1 with high refractive index (or, equivalently, low bandgap) are separated by two-layer spacers 2, each consisting of region 4 with intermediate refractive index (intermediate bandgap) and region 5 with low refractive index (high bandgap). The cumulative thickness of one active region 1 and two quarter-wave layers 4 and 5 is exactly equal to the half-wave period of the standing-wave intensity pattern at the designed wavelength of operation and is defined as a period of the structure. Hence, the optical thicknesses of the quarter-wave layers 4 and 5 are actually slightly smaller that the quarter of the designed wavelength. As shown in FIG. 2, the optical cavity is formed by the lower M periods and the upper $N+\frac{1}{2}$ periods. The last layer in the structure has approximately a quarter-wave thickness which is represented symbolically by adding a $\frac{1}{2}$ period to N. The half-wave phase shifter 3 is composed of the intermediate bandgap material, with the same refractive index as that of region 4. The purpose of the phase shifter is to provide round-trip phase matching at the designed wavelength of operation. The two parts of the distributed-feedback structure below 7 and above 8 the phase shifter 3 provide, along with the phase shifter, high reflectivity in the vertical direction at the designed wavelength of operation. The whole structure is grown epitaxially on top of substrate 9. The lasing radiation propagates in the direction perpendicular to the substrate plane and is collected through the top surface, shown on the right hand side of FIG. 2. The number of half-wave periods below and above the phase shifter is denoted by M and N, respectively.

Referring to FIG. 3, the structure of resonant-periodic-gain distributed-feedback laser is illustrated as a stack of gain regions 1, each with a thickness much smaller than the lasing wavelength in the material, separated from each other by half-wave spacers 2, each spacer made up of a pair of quarter-wave layers 4 and 5 respectively of intermediate- and low refractive index, each pair of quarter-wave layers providing partial reflection. A short-period superlattice of gradually varying composition may be inserted at the interfaces between the quarter wave layers 4 and 5 so that the electrical potential barriers between these passive components 4 and 5 are reduced. Such a superlattice is well known in the art and is shown and described in IEEE Photonics Technology Letters, Vol. 2, No. 4, April, 1990, pages 234–236. In accordance with the invention, each gain region 1 and half-wave spacer 2 together provide distributed feedback. Each gain region 1 represents a single- or multiple quantum well, with a typical thickness of each quantum well between 2 and 15 nm.

A better confinement of the carriers and photons in the vertical resonator can be achieved by surrounding the multilayer structure of FIGS. 1 or 3 with a confining or cladding layer 10 of material having an index of refraction lower than any other element of said structure. Such a device is illustrated in FIG. 4 in accordance with an embodiment of the present invention. The resonant-periodic-gain distributed-feedback medium 11 is produced by epitaxially growing a multilayer structure of suitable semiconductor materials on top of a substrate 9. Part of the medium 11 is then etched away to leave the columnar active region 11, as shown in FIG. 4. A confining region 12 of refractive index lower than the index of any of the layers in the columnar region 11 surrounds region 11 and is produced in a second epitaxial growth.

The buried-heterostructure embodiment of the present invention can also be utilized in conjunction with a vertical-current-flow electrical pumping scheme. Corresponding modifications of the structure described in the preceding paragraph are also shown in FIG. 4. Following the epitaxial regrowth process in which the column 11 is surrounded by material 12, an insulating layer 13 is deposited on the top surface. An annular window 14 is etched through the insulating layer 13 to define the contact area. Next the contacts to the top and bottom are attached as 15 and 16, respectively.

An embodiment of the present invention utilizing a transverse-junction scheme for electrical pumping of the structure shown in FIG. 1 or in FIG. 2 is illustrated in FIG. 5. There, the resonant-periodic-gain distributed-feedback medium 11 is epitaxially grown on an insulating or semi-insulating substrate 9 and is capped with an insulating or semi-insulating layer 13. There are two openings in the capping layer 13, an n-type region 17 and a p-type region 18, which are created by impurity diffusion, implantation, or any other suitable well known technique. The top surfaces of the regions 17 and 18 are then metallized, forming a negative electrode 19 and a positive electrode 20 separated by a portion of the insulating layer 13.

A one-dimensional array of the resonant-periodic-gain distributed-feedback surface-emitting lasers is shown schematically in FIG. 6. The device is a simple extension of the concept illustrated in FIG. 5. Instead of a single resonant-periodic-gain distributed-feedback medium, there are provided a plurality of such media 11 defined by a series of openings in the insulating capping layer 13. The openings define alternating n-type regions 17 and p-type regions 18 created by a process similar to that described in connection with FIG. 5. The array elements 11 can either be addressed individually via separate n-type contacts 19 and p-type contacts 20, or a uniformly pumped array can be obtained by connecting together all electrodes of the same polarity, as indicated in FIG. 6.

Referring to FIG. 7, individual resonant-periodic-gain distributed-feedback devices 11 may be arranged in a two-dimensional surface-emitting array of arbitrary configuration, using for example a buried-heterostructure scheme for electrical pumping. Here, individual emitters are separated by a confining medium 12 which is produced in a process similar to that described in connection with FIG. 4. These arrays can be used to produce high-power sources which may find applications in free-space communications and solid-state laser pumping.

OPERATION OF THE PREFERRED EMBODIMENT

As indicated in FIG. 1, the very thin active regions 1, each with a thickness much smaller than the lasing wavelength in the material, are arranged in such a way that at the designed wavelength of operation their positions coincide with the antinodes 6 of the vertical standing wave inside the resonator. This maximizes integrated spatial overlap between the optical field and the gain medium along the cavity axis. Therefore, the structure exhibits an enhancement of the effective gain per unit length of the active medium, a distinctive feature of resonant-periodic-gain designs. This enhancement is wavelength-selective, which is beneficial for single-mode operation of the device. In addition, the gain enhancement is maximum along the vertical direction (perpendicular to the plane of the substrate) and rapidly decreases for photons propagating at angles divergent from the vertical direction, thus reducing the undersirable competition of amplified-spontaneous-emission modes which otherwise represent a serious problem in conventional vertical-cavity surface-emitting lasers due to relatively large lateral dimensions of the active region when compared to its thickness.

Each gain region 1 represents a single- or multiple quantum well, with a typical thickness of each quantum well between 2 and 15 nm. The refractive index of the quantum-well material is higher than that of any of the spacer or phase shifter materials. The optical thickness of each spacer 2 separating the quantum-well active regions 1 from each other is approximately one-half of the peak wavelength of the quantum-well emission. With the exception of the phase shifter 3, each spacer consists of two intermediate- and low-refractive-index layers 4 and 5, respectively, with optical thicknesses approximately equal to a quarter of the lasing wavelength. The phase shifter 3 matches the round-trip phase condition of the optical cavity formed by the lower M periods and the upper $N+\frac{1}{2}$ periods shown in FIG. 2. High reflectivity in the vertical direction at the designed wavelength of operation is provided by two multilayer high reflectors 7 and 8 together with the phase shifter 3.

In the following, operation of a preferred embodiment of the invention using the GaAs/AlGaAs/AlAs III-V material system is described. The concept of a resonant-periodic-gain distributed-feedback laser can, however, be applied to other III-V material systems, such as InP/InGaAsP/InGaAs or II-VI and IV-VI semiconductors. Accordingly, in FIG. 2, the device may consist of a stack of 10-nm thick GaAs quantum wells 1 separated from each other by half-wave spacers 2, the adjacent regions 1 and 2 providing a portion of the distributed feedback. Each spacer 2 may contain two quarter-wave layers 4 and 5 composed of AlAs and $Al_{0.2}Ga_{0.8}As$, respectively. The phase shifter 3 is composed entirely of $Al_{0.2}Ga_{0.8}As$. The thickness of each quarter-wave AlAs layer 4 is 64 nm, while each quarter-wave $Al_{0.2}Ga_{0.8}As$ layer 5 is 54.9-nm thick. The whole resonant cavity may, according to a preferred embodiment, contain 38.5 periods, of which M=22 periods are at the bottom side (near the substrate) and $N+\frac{1}{2}=16.5$ periods are at the top side, counting from the center of the phase shifter region. The first layer at the substrate side is a low-index quarter-wave AlAs layer, and the last layer is an intermediate-index quarter-wave $Al_{0.2}Ga_{0.8}As$. The number of periods at the bottom side is higher than that at the top side because the reflectivity of the upper reflector is enhanced by a large refractive index difference at the AlGaAs-air interface. The reflectivities of the lower and upper reflectors 7 and 8 are 99.56% and 99.17%, respectively.

The total thickness of the preferred embodiment described above, including the quantum-well layers, is approximately 4.96 micrometers. For the sake of comparison, a resonant-periodic gain structure with the same cumulative thickness of the active medium and the same reflectivities of the lower and upper reflectors would have the thickness of 10.99 micrometers.

Another preferred embodiment of the invention which involves a buried-heterostructure resonant-periodic-gain distributed-feedback laser is illustrated in FIG. 4. This device has low-refractive-index quarter-wave layers 5 composed of $Al_{0.8}Ga_{0.2}As$, each 61.9-nm thick, while the compositions and thicknesses of the intermediate-index layers 4 and the quantum-well active regions 1 remain the same as described in the preceding paragraph. The structure of this device contains M=28 periods at the substrate side and $N+\frac{1}{2}=20.5$ periods above the center of the phase shifter 3. The reflectivities of the bottom and top reflectors are 99.57% and 99.11%, respectively. Part of the resonant-periodic-gain distributed-feedback structure is etched away to expose a columnar region 11 which may then be surrounded with AlAs 12 in a second epitaxial growth.

Various means can be used to pump the resonant-periodic-gain distributed-feedback laser structure, including optical, electron-beam and electrical pumping. The optical pumping involves irradiation of the structure with a light beam of sufficient intensity to reach the lasing threshold. The energy of pumping photons should be greater than the lasing transition energy of the quantum well. To increase absorption of the pumping photons, their energy may also be chosen to be slightly greater than the larger of the bandgaps of the quarter-wave layers. The electrical pumping can be achieved by vertical current flow, as in conventional vertical-cavity surface-emitting lasers, or by adopting a transverse-junction scheme.

In the vertical-current-flow pumping scheme, the resonant-periodic-gain distributed-feedback structure may be grown on top of an n-type substrate 9 (cf. FIG. 3). All the layers of the distributed-feedback structure may be p-type doped. An insulating layer 13 is then deposited on the top surface (see FIGS. 4 and 7, disregarding the burying region 12). An annular window 14 is etched through the insulating layer 13 to define the top contact area. Next the top and bottom contacts 15 and 16 are deposited. By biasing the device in forward direction, electrons and holes are injected into the quantum wells where they can recombine radiatively.

For improved transverse confinement of carriers and photons, a buried-type structure illustrated in FIGS. 4 and 7 can be used in the vertical-current-flow pumping scheme. Here, the burying material 12 may be n-doped. The p-type doping of the layers 11 constituting the distributed-feedback structure can be graded to facilitate uniform current injection into all quantum-well active regions.

In the transverse-junction electrical pumping scheme, illustrated in FIG. 5, the current injection takes place between the n- and p-type regions 17 and 18. The distributed feedback layers 11 can be lightly p- or n-type doped. Transverse-junction pumping can also be realized in a nipi type injection scheme, with alternating p- or n-type doping of spacer layers and with the quantum-well regions nominally undoped. The collection of carriers by the quantum wells can be enhanced by using graded-index structures with gradually increasing Al contents of the quarter-wave layers below and above each active region.

The buried-heterostructure design can also be used in combination with the transverse-junction pumping scheme. In this case, the p- (or n-) type lateral cladding regions 17 and 18 are regrown in the openings etched in the layers 11 down to the substrate. The doping type of one of the claddings is then changed by diffusion or implantation of n- (or p-) type impurities that overcompensate the as-grown doping.

What is claimed is:

1. An electromagnetic wave amplifying semiconductor device comprising a distributed feedback resonant periodic gain medium for receiving pumping energy, said medium comprising:

a. a plurality of thin semiconductor bodies disposed along a line essentially parallel to the direction of propagation of the electromagnetic wave, each said thin body acting as part of said gain medium, said thin bodies having a first predetermined refractive index with respect to the electromagnetic wave to be amplified in said device, each of said bodies being located in coincidence with an antinode of said electromagnetic wave;

b. a plurality of thick spacer body means disposed along said line and separating said thin bodies from each other, each of said spacer body means comprising first and second adjacent layers of material and each of said spacer body layers having a thickness approximately equal to one quarter the wavelength of said electromagnetic wave and much greater than the thickness of each of said thin bodies, the material of said first layer having with respect to said electromagnetic wave a second predetermined refractive index different from said first predetermined refractive index and the material of said second layer having with respect to said electromagnetic wave a third predetermined refractive index different from said first and second predetermined refractive indices, whereby each of the said spacer body means feeds back a portion of the electromagnetic wave, each of said spacer body means combined with its adjacent thin body gain medium thereby contributing a portion of the distributed feedback so that resonant periodic gain is produced in said medium responsive to the reception of the pumping energy.

2. The device of claim 1 further including phase shifting body means disposed along said line within said plurality of spacer body means for providing additional control of the feedback.

3. The device of claim 2 wherein said phase shifter body means has a fourth predetermined refractive index.

4. The device of claim 3 wherein each of said bodies is essentially planar oriented perpendicularly to said line.

5. The device of claim 1 wherein said distributed-feedback resonant-periodic-gain medium comprises an active medium in a laser.

6. The device of claim 3 wherein said first predetermined refractive index is substantially greater than said second predetermined refractive index, said second predetermined refractive index is substantially greater than said third predetermined refractive index, and said fourth predetermined refractive index is less than that of said thin body means.

7. The device of claim 4 wherein each of said thin body means comprises a direct gap semiconductor.

8. The device of claim 6 further comprising:

c. a substrate having a planar surface abutting said resonant-periodic-gain distributed-feedback medium and essentially perpendicular to said line.

9. The device of claim 8 further comprising:

d. external body means abutting said substrate and surrounding said resonant-periodic-gain distributed-feedback medium said external body means having a refractive index lower than all of said other body means constituting said gain medium.

10. The device of claim 8, in which said resonant-periodic-gain distributed-feedback medium forms a cylinder of arbitrary cross-sectional shape, the cross-section being defined in the plane parallel to the planar surface of the said substrate.

11. The device of claim 1, with the composition of said spacer body means changing gradually in the vicinity of said thin active bodies to form graded-index type quantum well active regions.

12. The device of claim 1, further comprising a short-period superlattice of gradually varying composition inserted at the interfaces between said first and second layers of material in the spacer body means, with the purpose to reduce the electrical potential barriers between said spacer body layers.

13. An electromagnetic wave semiconductor amplifier comprising a plurality of devices each having a distributed feedback resonant periodic gain medium for receiving pumping energy, said medium comprising:
   a. a plurality of thin semiconductor bodies disposed along a line essentially parallel to the direction of propagation of the electromagnetic wave, each said thin body acting as a part of said gain medium, said thin bodies having a first predetermined refractive index with respect to the electromagnetic wave to be amplified in said device, and each of said bodies being located in coincidence with an antinode of said electromagnetic wave;
   b. a plurality of thick spacer body means disposed along said line and separating said thin bodies from each other, each of said spacer body means comprising first and second adjacent layers of material, each of said spacer body layers having a thickness approximately equal to one quarter the wavelength of said electromagnetic wave and much greater than the thickness of each of said thin bodies, the material of said first layer having with respect to said electromagnetic wave a second predetermined refractive index different from said first predetermined refractive index and the material of said second layer having with respect said electromagnetic wave a third predetermined refractive index different from said first and second predetermined refractive indices, whereby each of said spacer body means feeds back a portion of the electromagnetic wave, each of said spacer body means combined with its adjacent thin body gain medium thereby contributing a portion of the distributed feedback, whereby resonant periodic gain is produced in said medium responsive to the reception of the pumping energy;
   c. phase shifter means having a fourth predetermined refractive index disposed along said line within said plurality of spacer body means;
   d. said first predetermined refractive index being substantially greater than said second predetermined refractive index, said second predetermined refractive index being substantially greater than said third predetermined refractive index, and said fourth predetermined refractive index being less than that of said thin body means, and e. a substrate having a planar surface essentially perpendicular to said line and abutting said medium of each device.

14. The amplifier of claim 13 wherein said plurality of devices is arranged in a one-dimensional array.

15. The amplifier of claim 13 wherein said plurality of devices is arranged in a two-dimensional array.

* * * * *